US010347615B2

(12) United States Patent
Yim et al.

(10) Patent No.: US 10,347,615 B2
(45) Date of Patent: Jul. 9, 2019

(54) METHOD OF FABRICATING AN OPTICAL MODULE THAT INCLUDES AN ELECTRONIC PACKAGE

(71) Applicant: Intel Corporation, Santa Clara, CA (US)

(72) Inventors: Myung Jin Yim, Santa Clara, CA (US); Jay S. Lee, Seoul (KR); Jong-Min Hong, Seoul (KR)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 15/554,144

(22) PCT Filed: Mar. 24, 2015

(86) PCT No.: PCT/US2015/022150
§ 371 (c)(1),
(2) Date: Aug. 28, 2017

(87) PCT Pub. No.: WO2016/153484
PCT Pub. Date: Sep. 29, 2016

(65) Prior Publication Data

US 2018/0047713 A1 Feb. 15, 2018

(51) Int. Cl.
*H01L 25/16* (2006.01)
*H01L 23/538* (2006.01)
*H01L 23/00* (2006.01)

(52) U.S. Cl.
CPC ........ *H01L 25/167* (2013.01); *H01L 23/5389* (2013.01); *H01L 24/19* (2013.01);
(Continued)

(58) Field of Classification Search
CPC ... H01L 25/167; H01L 24/19; H01L 23/5389; H01L 2924/18162; H01L 2924/14;
(Continued)

(56) References Cited

U.S. PATENT DOCUMENTS

2003/0161593 A1 8/2003 Stackhouse
2009/0159900 A1 6/2009 Basoor et al.
(Continued)

FOREIGN PATENT DOCUMENTS

CN 107431049 12/2017
TW 201703268 A 1/2017
WO WO-2016153484 A1 9/2016

OTHER PUBLICATIONS

"International Application Serial No. PCT/US2015/022150, Written Opinion dated Dec. 23, 2015", 8 pgs.
(Continued)

*Primary Examiner* — Bac H Au
(74) *Attorney, Agent, or Firm* — Schwegman Lundberg & Woessner, P.A.

(57) ABSTRACT

Some forms include an electronic package that includes a photo-detecting receiver IC and a receiver IC. The electronic package includes a mold that encloses the photo-detecting receiver IC and the receiver IC. The photo-detecting receiver IC and the receiver IC are adjacent to one another without touching one another. Other forms include an optical module that includes a substrate and an electronic package mounted on the substrate. The electronic package includes a photo-detecting receiver IC and a receiver IC that are enclosed within a mold. The photo-detecting receiver IC and the receiver IC are adjacent to one another without touching. Other forms include a method that includes forming a mold that includes a photo-detecting receiver IC and a receiver IC that are adjacent to one another without touching. The photo-detecting receiver IC includes optical components that are exposed on a surface of the mold.

10 Claims, 11 Drawing Sheets

30 59 59 38A 42 36 37 46 38B 39 35 32 33

(52) U.S. Cl.
CPC ............... *H01L 2224/04105* (2013.01); *H01L 2224/12105* (2013.01); *H01L 2224/24137* (2013.01); *H01L 2224/96* (2013.01); *H01L 2924/14* (2013.01); *H01L 2924/18162* (2013.01); *Y02E 10/52* (2013.01)

(58) Field of Classification Search
CPC ....... H01L 2224/96; H01L 2224/12105; H01L 2224/04105; H01L 2224/24137; Y02E 10/52
See application file for complete search history.

(56) References Cited

U.S. PATENT DOCUMENTS

| | | | | |
|---|---|---|---|---|
| 2009/0269075 | A1 | 10/2009 | Wong et al. | |
| 2011/0064418 | A1* | 3/2011 | Wang .................. | G02B 6/4201 398/139 |
| 2011/0235974 | A1 | 9/2011 | Tay et al. | |
| 2011/0297831 | A1 | 12/2011 | Yao et al. | |
| 2012/0086018 | A1 | 4/2012 | Yao et al. | |
| 2014/0097536 | A1 | 4/2014 | Schunk | |

OTHER PUBLICATIONS

"International Application Serial No. PCT/US2015/022150, International Search Report dated Dec. 23, 2015", 3 pgs.

"Taiwanese Application Serial No. 105102213, Office Action dated Apr. 20, 2017", w/translation of Search Report, 7 pgs.

"Taiwanese Application Serial No. 105102213, Response filed Jul. 21, 2017 to Office Action dated Apr. 20, 2017", w/o claims in English, 6 pgs.

"European Application Serial No. 15886642.6, Extended European Search Report dated Oct. 16, 2018", 7 pgs.

* cited by examiner 30
39
35
38B
46
33
42

38A
32
37
36

30
39
35
38B
46
33
42

38A
32
37
36

METHOD OF FABRICATING AN OPTICAL MODULE THAT INCLUDES AN ELECTRONIC PACKAGE

CROSS-REFERENCE TO RELATED APPLICATION

This application is a U.S. National Stage Filing under 35 U.S.C. 371 from International Application No. PCT/US2015/022150, filed on Mar. 24, 2015, and published as WO 2016/153484 on Sep. 29, 2016, which application is incorporated herein by reference in its entirety.

TECHNICAL FIELD

Embodiments described herein generally relate to a method of fabricating an electronic package, and more particularly to a method of fabricating an optical module that includes an electronic package.

BACKGROUND

Optical modules are continually being redesigned to deliver higher bandwidth densities with reduced power consumption and assembly costs. As an example, there is a need for optical modules that use a photonics device and are capable of carrying large amounts of data. High bandwidth optical modules are a key to solving ever increasing data traffic problems in data center systems for board to board and chip to chip applications.

Conventional packaging architectures usually require multi-die systems that typically require at least three package configurations. One package configuration includes stacked dice where there is direct attachment of a transmitter integrated circuit (hereafter IC) that includes a distributed driver directly attached to a silicon photonics transmitter die. Another package configuration typically includes a receiver IC closely located with a photo-detecting receiver IC. Still another package configuration commonly includes a power management IC that is attached to a package substrate (e.g., by flip chip attachment).

There are usually optical components on the silicon photonics transmitter and the photo-detecting receiver IC. As an example, there may be passive alignment between fiber arrays to the optical I/O areas the silicon photonics transmitter and the photo-detecting receiver IC. These optical I/O areas on the silicon photonics transmitter and the photo-detecting receiver IC typically overhang from the substrate where the silicon photonics transmitter and the photo-detecting receiver IC are mounted.

One of the drawbacks with conventional optical modules is that there are fine pitch flip chip interconnect areas for high density die stacking and higher RF performance, especially between the transmitter IC and the silicon photonics transmitter die as well as mounting photo-detecting receiver IC and the receiver IC to the substrate. Normally, the silicon photonics transmitter and the power management IC are attached to the substrate with large bump interconnect pitch in contrast to the fine pitch interconnect (e.g., 80 um pitch) that is used connect photo-detecting receiver IC and the receiver IC to the substrate. These differences between the size of the interconnects for the various components as well as the use of fine pitch interconnects generally make it difficult to have high assembly yield, robust reliability and good signal integrity for the components that form conventional optical modules.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example electronic packages, optical modules and methods described herein may be able to provide an optical module (or sub-component of an optical module that includes a photo-detecting receiver IC as well as a receiver IC that are formed into a single mold (e.g., using embedded wafer level ball grid array (hereafter eWLB) techniques). The example electronic packages, optical modules and methods described herein may provide (i) high throughput; (ii) high yield (e.g., by incorporating pre-optical module sub-component test capability), and (iii) low cost assembly for a silicon photonics module that may electrically be electronically and/or optically integrated into optical module.

As an example, using an eWLB fan out package structure may provide (i) high assembly throughput; (ii) a wafer level redistributed layer (RDL) that provides high speed electrical connectivity between a photo-detecting receiver IC and a receiver IC; and (iii) pre-assembly testability for a photo-detecting receiver IC and receiver IC subcomponent over an entire high density operating band width for the photo-detecting receiver IC.

Figure 1:
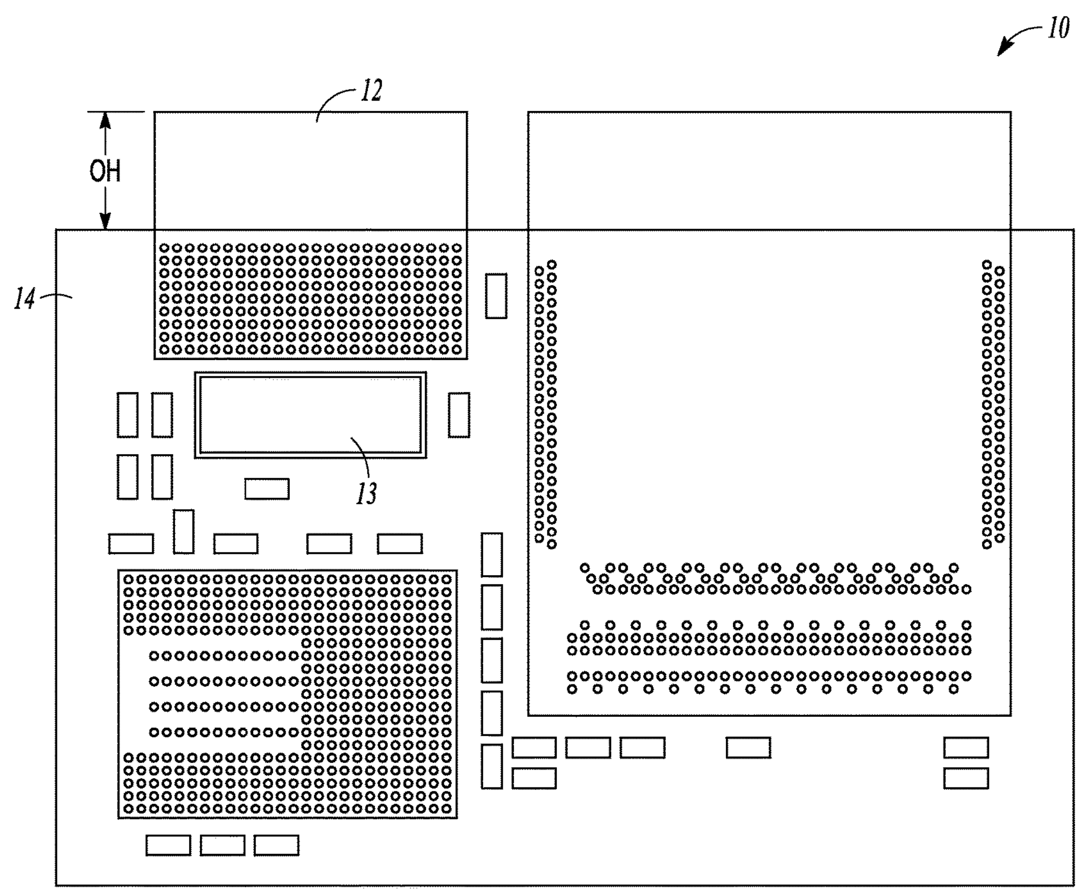
FIG. 1 is a prior art optical module.

In the prior art optical module 10 shown in FIG. 1, a photo-detecting receiver IC 12 and a receiver IC 13 are separately mounted to a substrate 14. The photo-detecting receiver IC 12 overhangs the substrate 14. This overhang (see dimension OH) often causes reliability issues with the optical module 10.

The example electronic packages, optical modules and methods described herein may dramatically mitigate photo-detecting receiver IC overhang issues that exist in conventional optical modules. The overhang issues are reduced because there is a greater surface area of the mold that includes the photo-detecting receiver IC in the example electronic packages, optical modules and methods described herein when compared to conventional optical modules.

In addition, there is a reduced number of die application processes (i.e., from four dies to three dies) associated with fabricating the example electronic packages, optical modules and methods described herein. This reduction in the number of die application processes may streamline the manufacturing processes associated with fabricating the example electronic packages, optical modules and methods described herein.

The example electronic packages, optical modules and methods described herein may also mitigate die crack issues associated with mounting the photo-detecting receiver IC and the receiver IC to the optical module substrate. The photo-detecting receiver IC and the receiver IC in conventional optical module often have die crack issues associated with mounting the photo-detecting receiver IC and the receiver IC to the optical module substrate due to underfill overflow.

In addition, there may be a reduced need for any copper pillars to be utilized in the example electronic packages, optical modules and methods described herein. As an example, many of the difficult to fabricate copper pillars that are typically used with the photo-detecting receiver IC and the receiver IC in conventional optical modules may be eliminated because high speed signals may be sent between the photo-detecting receiver IC and the receiver IC using a redistribution layer (hereafter RDL).

The example electronic packages and methods described herein may also be tested at a wafer level. This ability to test at a wafer level may be an improvement over conventional electronic packages where the photo-detecting receiver IC and the receiver IC are typically tested individually.

Figure 2:
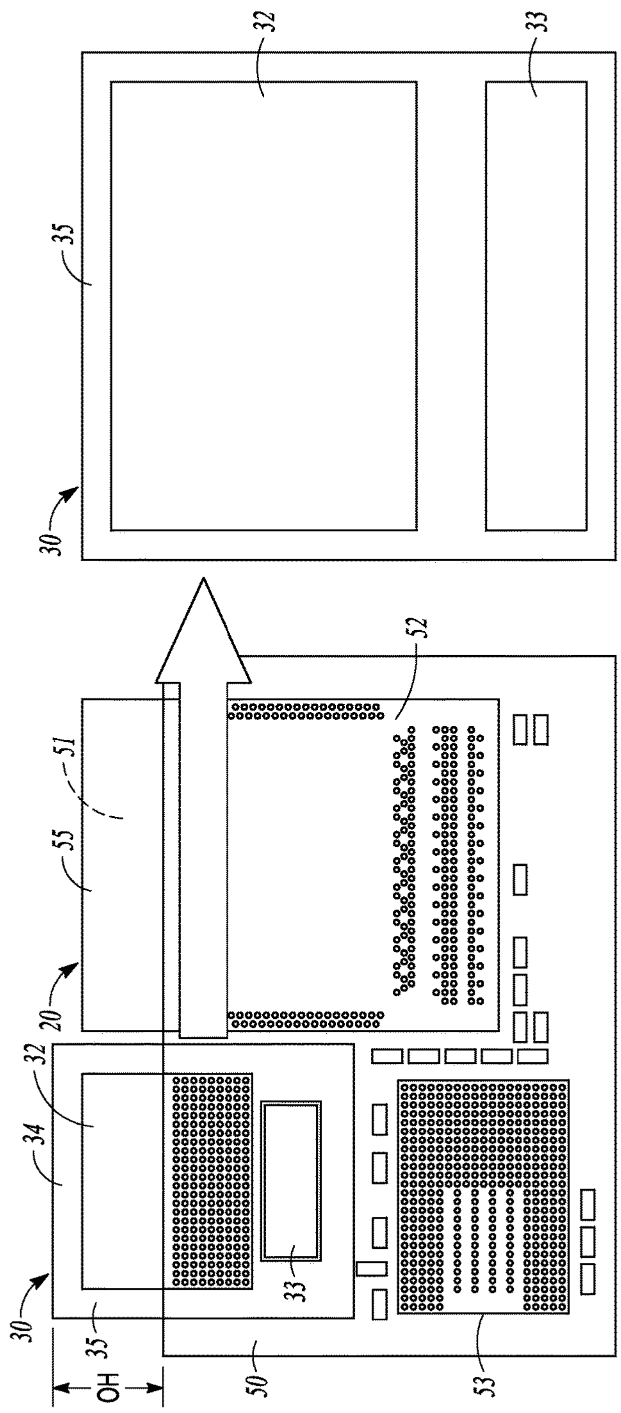
FIG. 2 is an example optical module.
Figure 3:
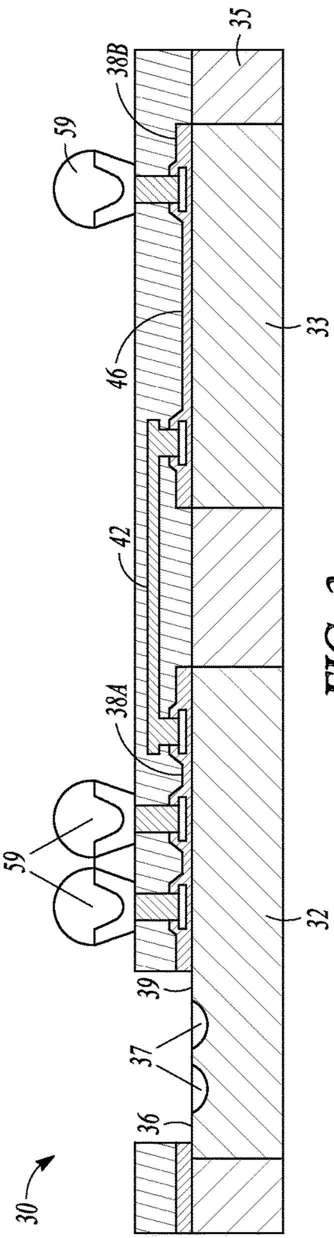
FIG. 3 is a section view illustrating an example electronic package that may be used in the optical module shown in FIG. 2.

FIG. 2 is an example optical module 20. FIG. 3 is a section view illustrating an example electronic package 30 that may be used in the optical module 20 shown in FIG. 2.

The electronic package 30 includes a photo-detecting receiver IC 32 and a receiver IC 33. A mold 35 encloses the photo-detecting receiver IC 32 and the receiver IC 33. The photo-detecting receiver IC 32 and the receiver IC 33 are adjacent to one another without touching one another. The relative location of the photo-detecting receiver IC 32 and the receiver IC 33 within the mold 35 will depend in part on the overall size and configuration of the electronic package 30 as well as the overall size and configuration of the photo-detecting receiver IC 32 and the receiver IC 33.

In some forms, optical components 37 may be exposed on a portion 36 of the mold 35. As an example, the optical components may include a micro-lens array. In addition, the portion 36 of the mold 35 that includes the exposed optical components 37 may be on a surface 39 of the mold 35.

Figure 4:
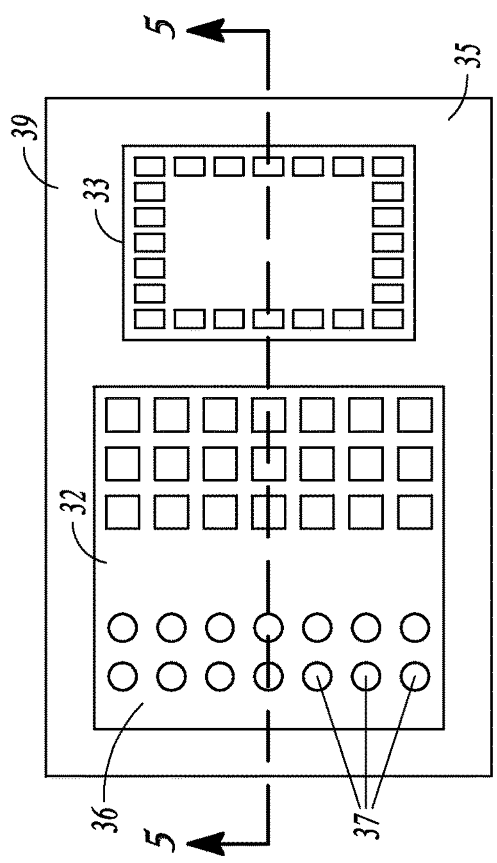
FIG. 4 is a top view of the example electronic package shown in FIG. 2 where the electronic package is partially fabricated.
Figure 5:
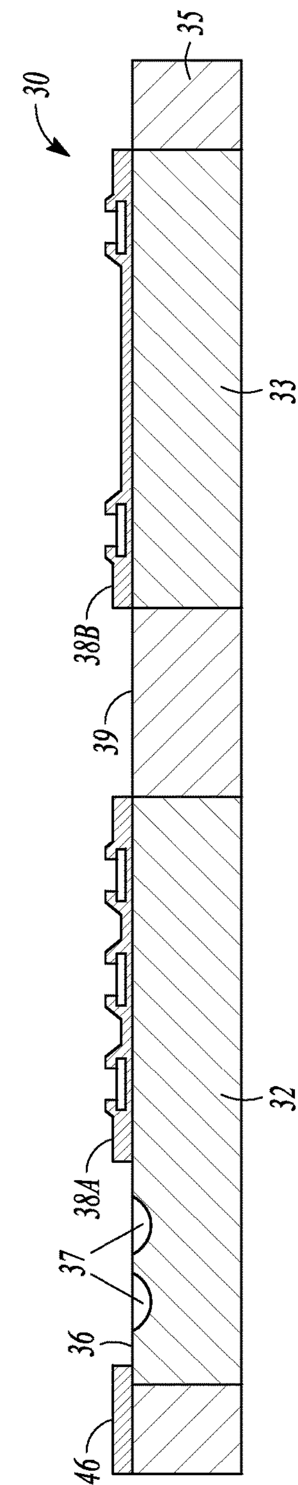
FIG. 5 is a section view of the example partially fabricated electronic package shown in FIG. 4 taken along line 5-5.

As shown also in FIGS. 4 and 5, the electronic package 30 may further include electrical connections 38A, 38B on the surface 39 of the mold 35. Some electrical connections 38A are electrically connected to the photo-detecting receiver IC 32 and some electrical connections 38B are electrically connected to the receiver IC 33.

It should be noted that "on the surface" 39 of the mold 35 may refer to items being (i) directly attached (or mounted) to the surface 39 of the mold 35; (ii) directly attached (or mounted) to a passivation layer on the surface 39 of the mold 35; (iii) directly attached (or mounted) to a portion of the surface 39 of the mold 35 and a portion of a passivation layer on the surface 39 of the mold 35; (iv) directly attached (or mounted) to another type of layer on the surface 39 of the mold 35; or (v) directly attached (or mounted) to a portion of the surface 39 of the mold 35 and/or a portion of a passivation layer on the surface 39 of the mold 35 and/or another type of layer on the surface 39 of the mold 35. The type and manner in which items may (or may not) be mounted directly to surface 39 of the mold 35, or mounted onto one or more various layers on the surface 39 of the mold 35 will depend in part on how the electronic package 30 is manufactured as well as the application where the electronic package 30 is to used (among other factors).

In some forms of the electronic package 30, the surfaces of the mold 35 in the electronic package 30 may include additional electrical connections for connection to other electronic components within the mold 35 or for attachment to the mold 35. In addition, the electrical connections 38A, 38B may include pads configured for indirect (or direct) connection to solder balls 59 (see FIGS. 3 and 17).

As shown in FIGS. 3 and 12-17, the electronic package 30 may further include an electrical redistribution layer 42 that electrically connects some of the electrical connections 38A that are electrically connected to the photo-detecting receiver IC 32 to some of the electrical connections 38B that are electrically connected to the receiver IC 33. In some forms, the electrical redistribution layer 42 may include a plurality of electrical redistribution layers that electrically connects some of the electrical connections 38A that are electrically connected to the photo-detecting receiver IC 32 to some of the electrical connections 38B that are electrically connected to the receiver IC 33. The configuration and size of the electrical redistribution layer(s) 42 will depend in part on the size and configuration of the mold 35, the photo-detecting receiver IC 32, and the receiver IC 33 (among other factors).

As shown in FIG. 2, the optical module 20 includes a substrate 50 with the electronic package 30 mounted on the substrate 50. The electronic package 30 may be any of the electronic packages 30 described herein.

The optical module 20 may further includes a photonics transmitter die 51 mounted to the substrate 50. In addition, the optical module 20 may further include a transmitter IC 52 stacked onto the photonics transmitter die 51 and electrically connected to the photonics transmitter die 51. It should be noted the size, type and configuration of the photonics transmitter die 51 and the transmitter IC 52 will depend in part on application where the optical module 20 will be used.

In some forms, the optical module 20 may further include a power management IC 53 (see FIG. 2) mounted on the substrate 50. The power management IC 53 may be configured to supply power to one or more of the photonics transmitter die 51, the transmitter IC 52, the photo-detecting receiver IC 32 and the receiver IC 33. The size, type and configuration of the photonics transmitter die 51 and the transmitter IC 52 will depend in part on application where the optical module 20 will be used as well as the types of photonics transmitter dies 51, transmitter ICs 52, photo-detecting receiver ICs 32 and receiver ICs 33 that are included in the optical module 20.

The photo-detecting receiver IC 32 may include a section 34 that overhangs the substrate 50. In addition, the photonics transmitter die 51 (and possibly the transmitter IC 52) may each include a portion 55 that overhangs the substrate 50 (see dimension OH in FIG. 2). The degree to which the section 34 of the photo-detecting receiver IC 32 and the portion(s) 55 of the photonics transmitter die 51 (and possibly the transmitter IC 52) overhang the substrate 50 will depend in part on the number of optical components 37 that are included in the photo-detecting receiver IC 32 and the photonics transmitter die 51.

Figure 17:
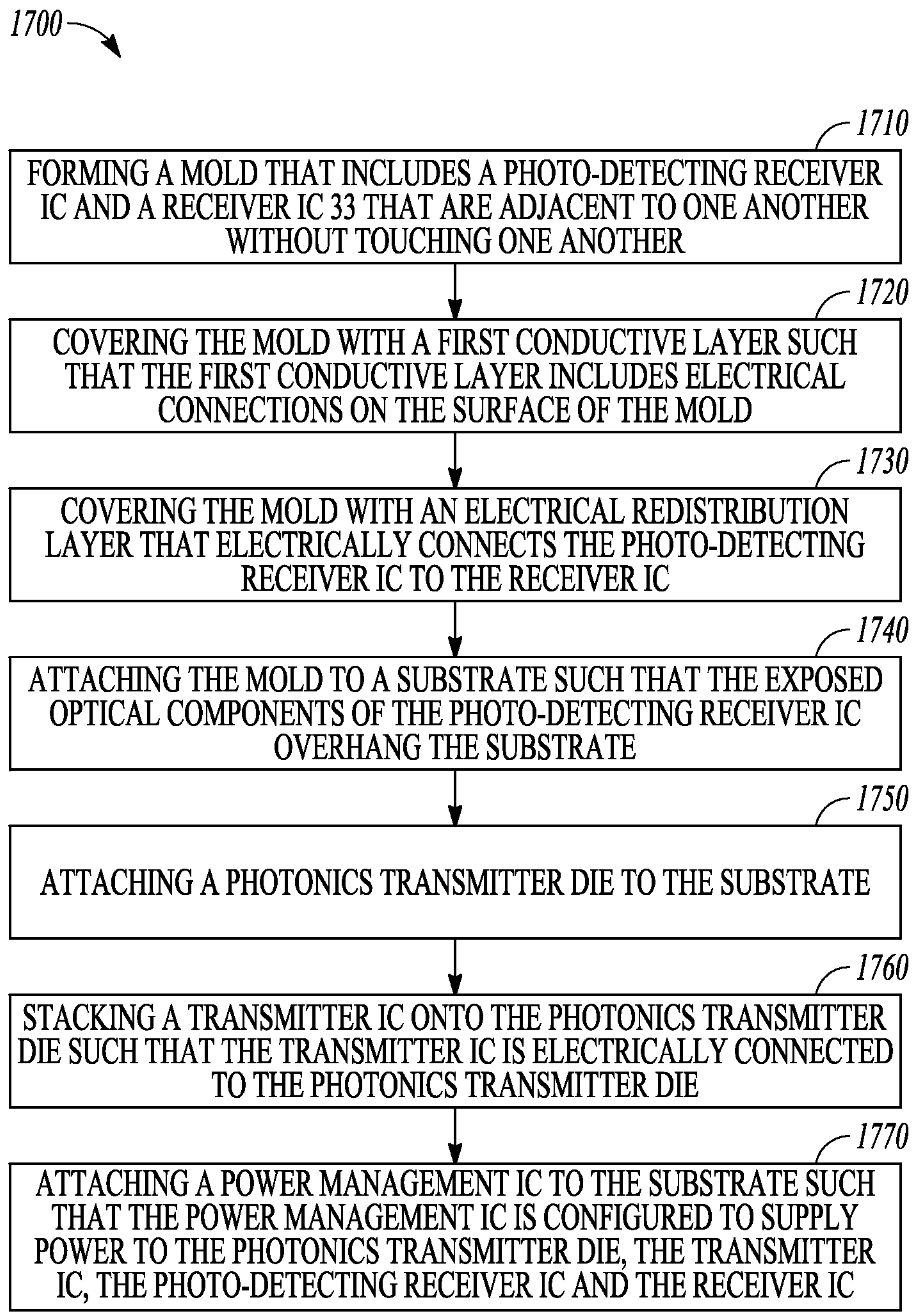
FIG. 17 is a flow diagram of a method of fabricating an electronic package and an optical module that includes the electronic package.

FIG. 17 illustrates a flow diagram of an example method [1700] of forming an optical module 20 that includes an electronic package 30. FIGS. 4-16 show corresponding assemblies for portions of the method [1700] shown in FIG. 17.

The method [1700] includes [1710] forming a mold 35 that includes a photo-detecting receiver IC 32 and a receiver IC 33 that are adjacent to one another without touching one another. The photo-detecting receiver IC 32 includes optical components 37 that are exposed on a surface 39 of the mold 35.

Figure 6:
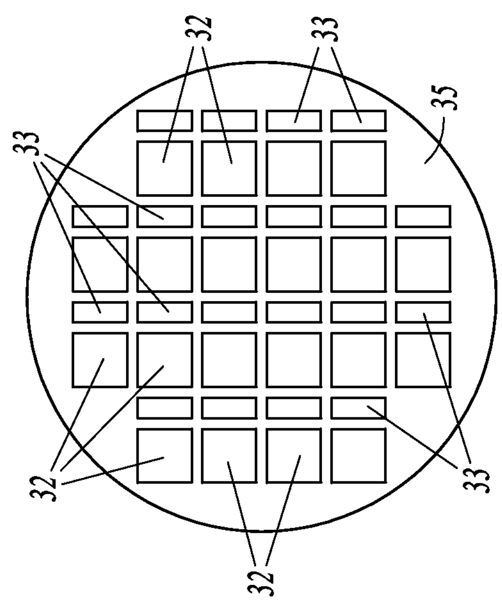
FIG. 6 is a wafer level top view of the example partially fabricated electronic package shown in FIG. 4.
Figure 7:
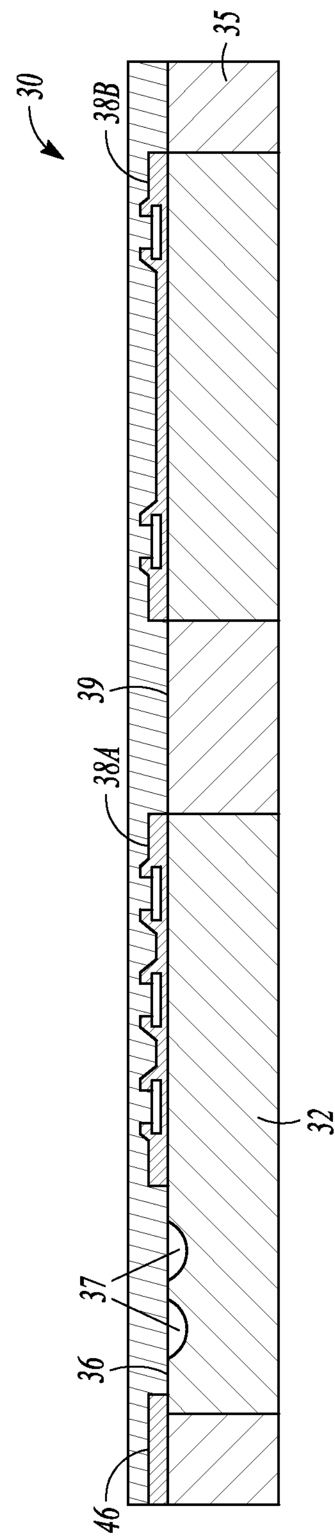
FIG. 7 is a section view of the example partially fabricated electronic package shown in FIG. 6 taken along line 7-7.
Figure 8:
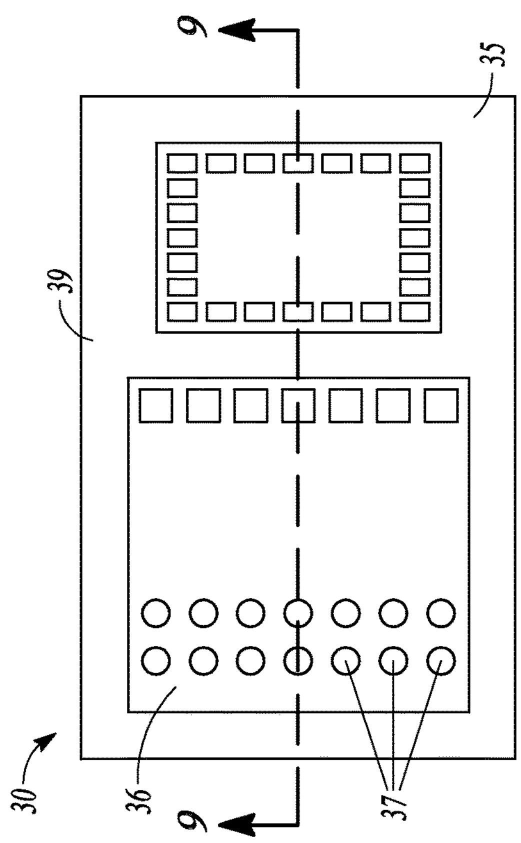
FIG. 8 is a top view of the example electronic package shown in FIG. 7 where the electronic package is further fabricated.
Figure 9:
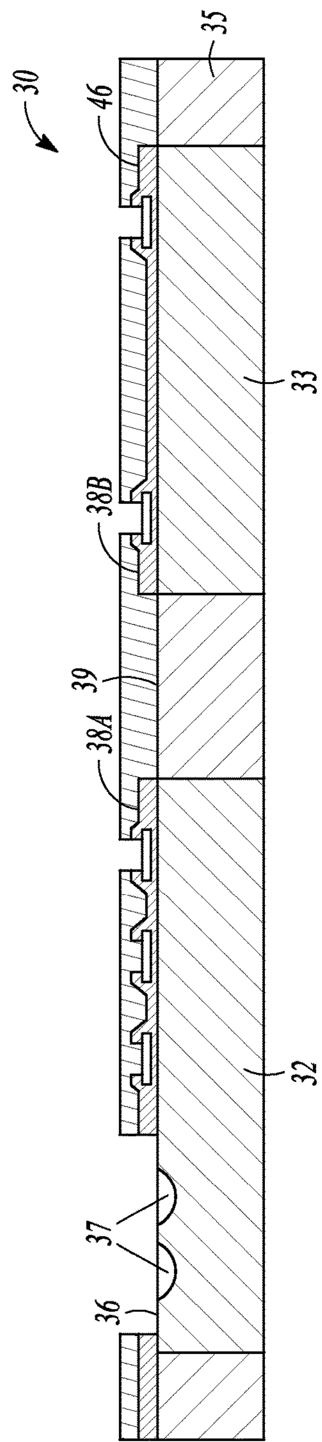
FIG. 9 is a section view of the example partially fabricated electronic package shown in FIG. 8 taken along line 9-9.
Figure 10:
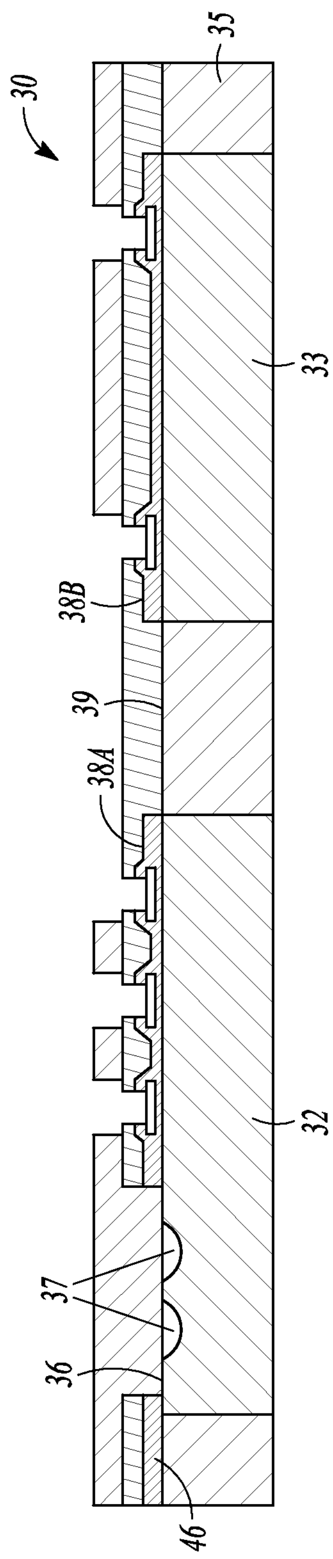
FIG. 10 is a section view of the example partially fabricated electronic package shown in FIG. 9 where the electronic package is further fabricated.
Figure 11:
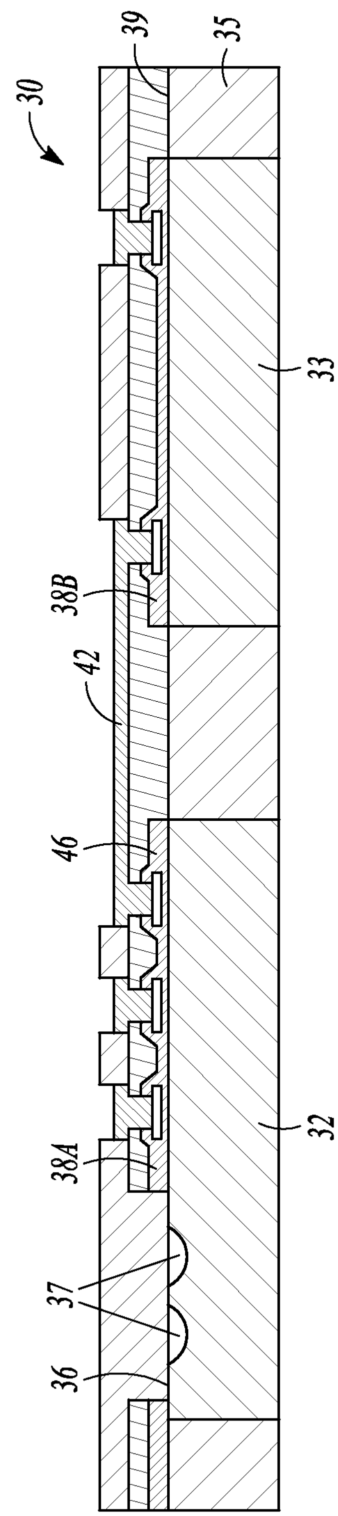
FIG. 11 is a section view of the example partially fabricated electronic package shown in FIG. 10 where the electronic package is further fabricated.
Figure 12:
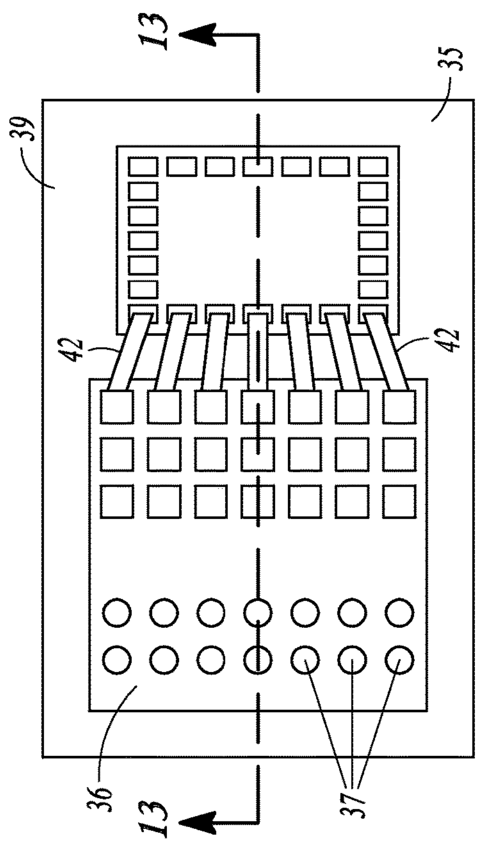
FIG. 12 is a top view of the example electronic package shown in FIG. 11 where the electronic package is further fabricated.
Figure 13:
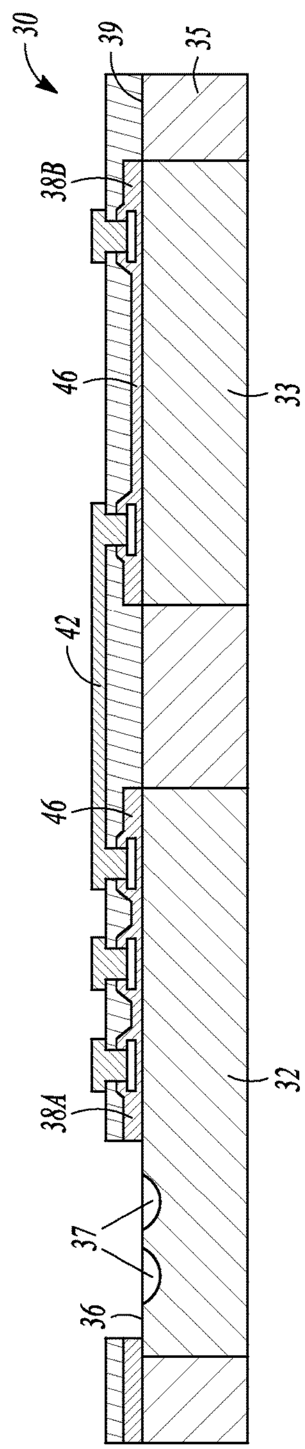
FIG. 13 is a section view of the example partially fabricated electronic package shown in FIG. 12 taken along line 13-13.
Figure 14:
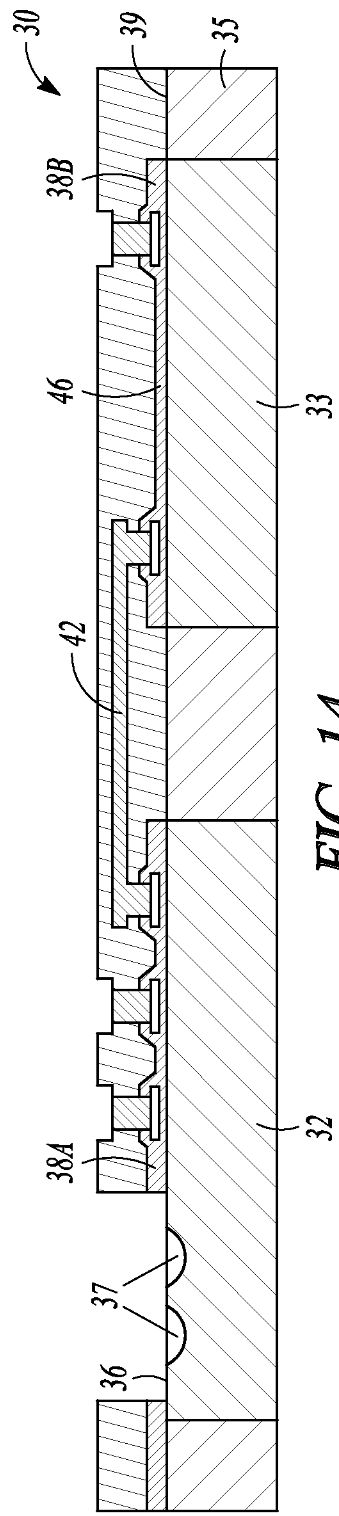
FIG. 14 is a section view of the example partially fabricated electronic package shown in FIG. 13 where the electronic package is further fabricated.
Figure 15:
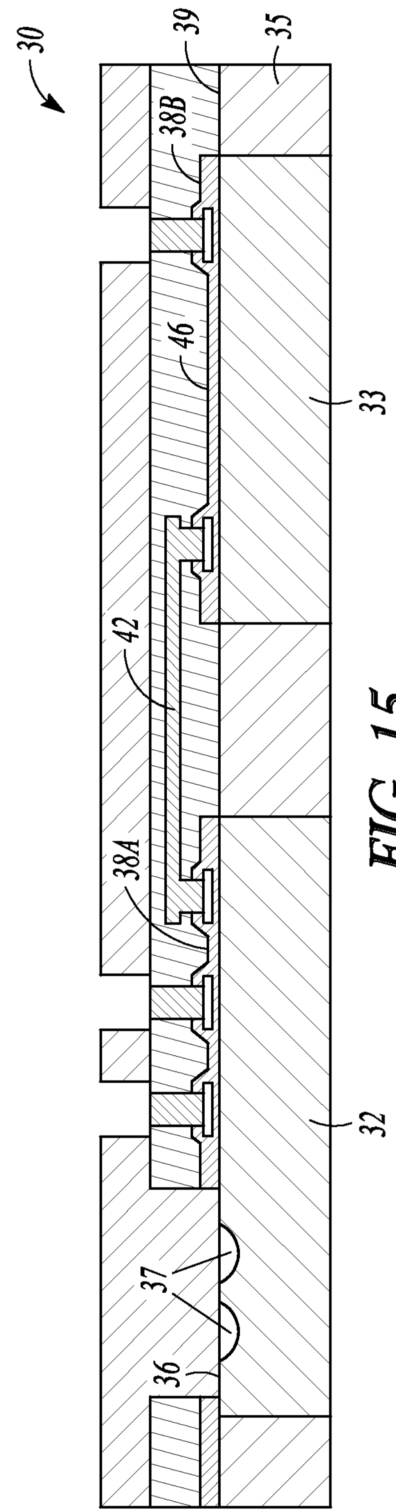
FIG. 15 is a section view of the example partially fabricated electronic package shown in FIG. 14 where the electronic package is further fabricated.
Figure 16:
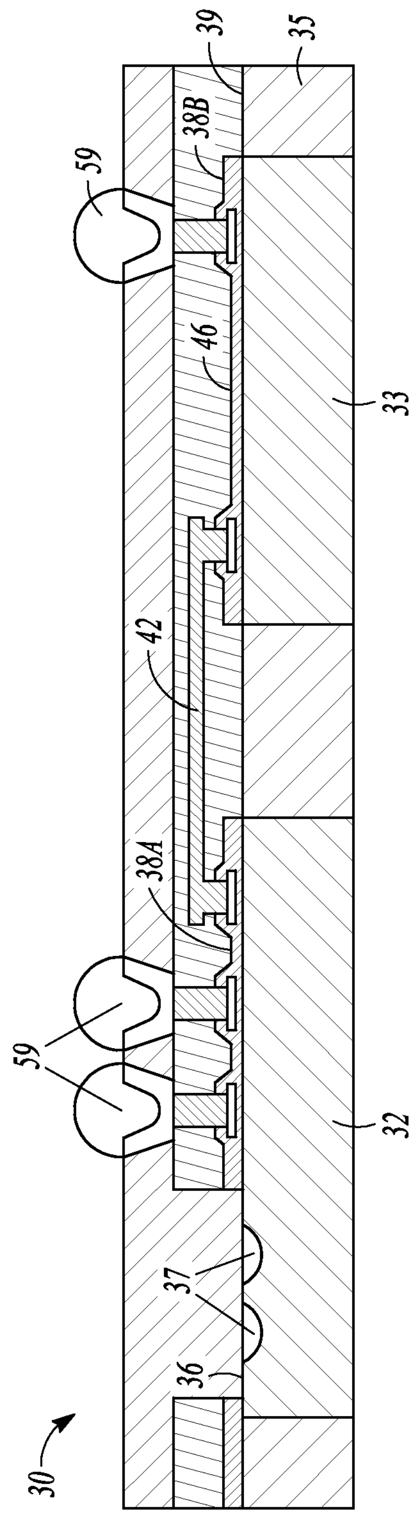
FIG. 16 is a section view of the example partially fabricated electronic package shown in FIG. 16 where the electronic package is further fabricated.

The method [1700] further includes [1720] covering the mold 35 with a first conductive layer 46 such that the first conductive layer 46 includes electrical connections 38A, 38B on the surface 39 of the mold 35 (see, e.g., FIGS. 4-6 with FIG. 6 showing the operation at a wafer level).

The first conductive layer 46 may be attached to the mold 35 using plating (or some other type of deposition). It should be noted the first conductive layer 46 may be patterned in any manner (e.g., etching) that is known or discovered in the future.

The first conductive layer 46 includes some of the electrical connections 38A that may be electrically connected to the photo-detecting receiver IC 32 and some of the electrical connections 38B that may be electrically connected to the receiver IC 33.

FIGS. 7-11 illustrate further potential fabrication processes for forming the electronic package 30. As examples, the patterned first conductive layer 36 may be covered with a buildup layer, which is then patterned to form openings in the buildup layer. In addition, the patterned buildup layer may be covered with a second conductive layer that fills the openings in the patterned buildup layer to electrically connect the second conductive layer to the first patterned conductive layer 46.

The method [1700] further includes [1730] covering the mold 35 with an electrical redistribution layer 42 that electrically connects the photo-detecting receiver IC 32 to the receiver IC 33 (see, e.g., FIGS. 12-17). The electrical redistribution layer 42 may be part of the second conductive layer and electrically connect some of the electrical connections 38A that are electrically connected to the photo-detecting receiver IC 32 to some of the electrical connections 38B that are electrically connected to the receiver IC 33. In some forms, the electrical redistribution layer 42 may include a plurality of electrical redistribution layers.

The electrical redistribution layer 42 may be patterned and then covered with a solder resist, which is then patterned to form openings in the solder resist. Electrical contacts 59 (e.g., solder balls) may be placed within the openings in the solder resist. The electrical contacts 59 are electrically connected to the first second conductive layer 46.

As shown in FIG. 2, the method [1700] may further include [1740] attaching the mold 35 to a substrate 50 such that the exposed optical components 37 (not visible in FIG. 2) of the photo-detecting receiver IC 32 overhang the substrate 50. The degree to which the mold 35 overhangs the substrate will depend in part on (i) the number and location of the exposed optical components 37 on the photo-detecting receiver IC 32; and (ii) the size of the photo-detecting receiver IC 32 and the receiver IC 33 (among other factors).

The method [1700] may further include [1750] attaching a photonics transmitter die 51 to the substrate 50 and [1760] stacking a transmitter IC 52 onto the photonics transmitter die 51 such that the transmitter IC 52 is electrically connected to the photonics transmitter die 51. The method [1700] may further include [1770] attaching a power management IC 53 to the substrate 50 such that the power management IC 53 is configured to supply power to the photonics transmitter die 51, the transmitter IC 52, the photo-detecting receiver IC 32 and the receiver IC 33.

In some forms, [1750] attaching the photonics transmitter die 51 to the substrate 50 may include attaching the photonics transmitter die 51 to the substrate 50 such that optical components (not visible in FIG. 2) in the photonics transmitter die 51 overhang from the substrate 50. The degree to which the photonics transmitter die 51 overhangs the substrate 50 will depend in part on (i) the number of exposed optical components on the photonics transmitter die 51; and (ii) the size of the photonics transmitter die 51 and the stacked transmitter IC 52 (among other factors).

The example electronic packages, optical modules and methods described herein may promote the integration of an electronic package that includes a mold having a photo-detecting receiver IC and receiver IC formed therein into an optical module. This integration of such an electronic package (e.g., when using eWLB) into an optical module may provide high throughput, low cost and high assembly yield. The integration may also provide an optical module that is more compact in size and provide an electronic/optical interconnect for high performance computing.

Figure 18:
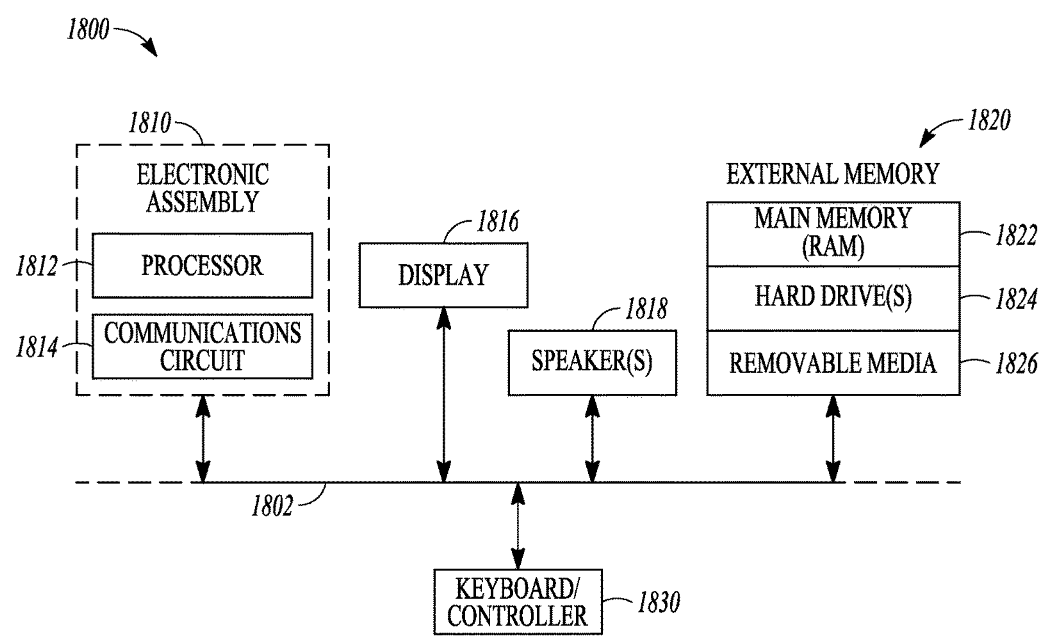
FIG. 18 is a block diagram of an electronic apparatus incorporating at least one of the electronic packages, optical modules and methods described herein.

FIG. 18 is a block diagram of an electronic apparatus 1800 incorporating at least one of the optical modules, electronic packages and/or methods described herein. Electronic apparatus 1800 is merely one example of an electronic system in which embodiments of the present invention can be used. Examples of electronic apparatuses 1800 include, but are not limited to personal computers, tablet computers, mobile telephones, game devices, MP3 or other digital music players, etc. In this example, electronic apparatus 1800 comprises a data processing system that includes a system bus 1802 to couple the various components of the system. System bus 1802 provides communications links among the various components of the electronic apparatus 1800 and can be implemented as a single bus, as a combination of busses, or in any other suitable manner.

In one embodiment, an electronic package 1810 includes a processor 1812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 1810 are a custom circuit, an application-specific integrated circuit (ASIC), or the like, such as, for example, one or more circuits (such as a communications circuit 1814) for use in wireless devices like mobile telephones, tablet computers, laptop computers, two-way radios, and similar electronic systems. The IC can perform any other type of function.

The electronic apparatus 1800 can also include an external memory 1820, which in turn can include one or more memory elements suitable to the particular application, such as a main memory 1822 in the form of random access memory (RAM), one or more hard drives 1824, and/or one or more drives that handle removable media 1826 such as compact disks (CD), flash memory cards, digital video disk (DVD), and the like.

The electronic apparatus 1800 can also include a display device 1816, one or more speakers 1818, and a keyboard and/or controller 1830, which can include a mouse, trackball, touch screen, voice-recognition device, or any other device that permits a system user to input information into and receive information from the electronic apparatus 1800.

To better illustrate the methods, electronic packages and optical modules disclosed herein, a non-limiting list of embodiments is provided here.

Example 1 includes an electronic package. The electronic package includes a photo-detecting receiver IC and a receiver IC. The electronic package includes a mold that encloses the photo-detecting receiver IC and the receiver IC. The photo-detecting receiver IC and the receiver IC are adjacent to one another without touching one another Example 2 includes the electronic package of claim 1, wherein the mold includes a portion where optical components on the photo-detecting receiver IC are exposed.

Example 3 includes the electronic package of any one of examples 1-2, further including electrical connections on a surface of the mold. Some electrical connections are electrically connected to the photo-detecting receiver IC and some electrical connections are electrically connected to the receiver IC.

Example 4 includes the electronic package of any one of examples 1-3, wherein the portion of the mold that includes exposed optical components is on a surface of the mold.

Example 5 includes the electronic package of any one of examples 1-4, wherein the electrical connections include pads configured for connection to solder balls.

Example 6 includes the electronic package of examples 1-5, further including an electrical redistribution layer that electrically connects some of the electrical connections that are electrically connected to the photo-detecting receiver IC to some of the electrical connections that are electrically connected to the receiver IC.

Example 7 includes the electronic package of examples 2-6, wherein the optical components include micro-lens arrays.

Example 8 includes an optical module. The optical module includes a substrate and an electronic package mounted on the substrate. The electronic package includes a photo-detecting receiver IC and a receiver IC that are enclosed within a mold. The photo-detecting receiver IC and the receiver IC are adjacent to one another without touching one another.

Example 9 includes the optical module of example 8, wherein the mold includes a portion where optical components on the photo-detecting receiver IC are exposed.

Example 10 includes the optical module of any one of examples 8-9, wherein the electronic package further includes electrical connections on a surface of the mold, wherein some electrical connections are electrically connected to the photo-detecting receiver IC and some electrical connections are electrically connected to the receiver IC, and an electrical redistribution layer that electrically connects some of the electrical connections that are electrically connected to the photo-detecting receiver IC to some of the electrical connections that are electrically connected to the receiver IC, and wherein the electrical connections include pads configured for connection to solder balls.

Example 11 includes the optical module of any one of examples 8-10, wherein the portion of the mold that includes exposed optical components is on a surface of the mold.

Example 12 includes the optical module of examples 8-11, further including a photonics transmitter die mounted to the substrate, and a transmitter IC stacked onto the photonics transmitter die and electrically connected to the photonics transmitter die.

Example 13 includes the optical module of any one of examples 8-12, further including a power management IC mounted on the substrate, wherein the power management IC is configured to supply power to the photonics transmitter die, the transmitter IC, the photo-detecting receiver IC and the receiver IC.

Example 14 includes the optical module of any one of examples 8-13, wherein the photo-detecting receiver IC includes a section that overhangs the substrate.

Example 15 includes the optical module of any one of examples 8-14, wherein the photonics transmitter die includes a portion that overhangs the substrate.

Example 16 is a method that includes forming a mold that includes a photo-detecting receiver IC and a receiver IC which are adjacent to one another without touching one another and optical components in the photo-detecting receiver IC are exposed on a surface of the mold.

Example 17 includes the method of example 16, further including covering the mold with a conductive layer such that the conductive layer is electrically connected to the photo-detecting receiver IC and the receiver IC; and covering the mold with an electrical redistribution layer that electrically connects the photo-detecting receiver IC to the receiver IC.

Example 18 includes the method of any one of examples 16-17, further including attaching the mold to a substrate such that the exposed optical components overhang the substrate.

Example 19 includes the method of any one of examples 16-18, further including attaching a photonics transmitter die to the substrate; stacking a transmitter IC onto the photonics transmitter die such that the transmitter IC is electrically connected to the photonics transmitter die; and attaching a power management IC to the substrate such that the power management IC provides power to one or more of the photonics transmitter die, transmitter IC, photo-detecting receiver IC and receiver IC.

Example 20 includes the method of any one of examples 16-19, wherein attaching the photonics transmitter die to the substrate includes attaching the photonics transmitter die to the substrate such that optical components in the photonics transmitter die overhang from the substrate.

This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An optical module comprising:

a substrate;

an electronic package mounted on the substrate, wherein the electronic package includes a photo-detecting receiver IC and a receiver IC that are enclosed within a mold, wherein the photo-detecting receiver IC and the receiver IC are adjacent to one another without touching one another;

a photonics transmitter die mounted to the substrate; and a transmitter IC stacked onto the photonics transmitter die and electrically connected to the photonics transmitter die, wherein the photo-detecting receiver IC includes a section that overhangs the substrate.

2. The optical module of claim 1, wherein the mold includes a portion where optical components on the photo-detecting receiver IC are exposed.

3. The optical module of claim 2, wherein the electronic package further includes electrical connections on a surface of the mold, wherein some electrical connections are electrically connected to the photo-detecting receiver IC and some electrical connections are electrically connected to the receiver IC, and an electrical redistribution layer that electrically connects some of the electrical connections that are electrically connected to the photo-detecting receiver IC to some of the electrical connections that are electrically connected to the receiver IC, and wherein the electrical connections include pads configured for connection to solder balls.

4. The optical module of claim 2, wherein the portion of the mold that includes exposed optical components is on a surface of the mold.

5. The optical module of claim 1, further comprising a power management IC mounted on the substrate, wherein the power management IC is configured to supply power to the photonics transmitter die, the transmitter IC, the photo-detecting receiver IC and the receiver IC.

6. The optical module of claim 1, wherein the photonics transmitter die includes a portion that overhangs the substrate.

7. A method comprising:

forming a mold that includes a photo-detecting receiver IC and a receiver IC which are adjacent to one another without touching one another and optical components in the photo-detecting receiver IC are exposed on a surface of the mold; and attaching the mold to a substrate such that the exposed optical components overhang the substrate.

8. The method of claim 7, further comprising:

covering the mold with a conductive layer such that the conductive layer is electrically connected to the photo-detecting receiver IC and the receiver IC; and covering the mold with an electrical redistribution layer that electrically connects the photo-detecting receiver IC to the receiver IC.

9. The method of claim 7, further comprising:

attaching a photonics transmitter die to the substrate;

stacking a transmitter IC onto the photonics transmitter die such that the transmitter IC is electrically connected to the photonics transmitter die; and attaching a power management IC to the substrate such that the power management IC provides power to one or more of the photonics transmitter die, transmitter IC, photo-detecting receiver IC and receiver IC.

10. The method of claim 9, wherein attaching the photonics transmitter die to the substrate includes attaching the photonics transmitter die to the substrate such that optical components in the photonics transmitter die overhang from the substrate.

* * * * *